(12) United States Patent
Maekawa et al.

(10) Patent No.: US 8,350,853 B2
(45) Date of Patent: Jan. 8, 2013

(54) INTERPOLATION PROCESSING METHOD AND INTERPOLATION PROCESSOR

(75) Inventors: Takashi Maekawa, Kanagawa (JP); Shu-Ichi Gofuku, Shizuoka (JP); Shigefumi Tamura, Tokyo (JP)

(73) Assignee: National University Corporation Yokohama National University, Yokohama-shi, Kanagawa (JP)

( * ) Notice: Subject to any disclaimer, the term of this patent is extended or adjusted under 35 U.S.C. 154(b) by 457 days.

(21) Appl. No.: 12/738,890

(22) PCT Filed: Oct. 24, 2008

(86) PCT No.: PCT/JP2008/069306
§ 371 (c)(1),
(2), (4) Date: Apr. 20, 2010

(87) PCT Pub. No.: WO2009/057517
PCT Pub. Date: May 7, 2009

(65) Prior Publication Data
US 2010/0220099 A1 Sep. 2, 2010

(30) Foreign Application Priority Data
Oct. 30, 2007 (JP) ................................. 2007-282122

(51) Int. Cl.
*G06T 15/30* (2011.01)
*G06T 15/00* (2011.01)
*G06T 11/20* (2006.01)
*G06K 9/32* (2006.01)

(52) U.S. Cl. ........ 345/423; 382/300; 345/419; 345/442; 345/441

(58) Field of Classification Search ........................ None
See application file for complete search history.

(56) References Cited

U.S. PATENT DOCUMENTS
2009/0303235 A1  12/2009  Maekawa

FOREIGN PATENT DOCUMENTS
JP   2004-192209 A    7/2004
WO   2007/083602 A1   7/2007

OTHER PUBLICATIONS

Takashi Maekawa, Yasunori Matsumoto, Ken Namiki, Interpolation by geometric algorithm, Computer-Aided Design, vol. 39, Issue 4, Apr. 2007, pp. 313-323, ISSN 0010-4485.*

(Continued)

*Primary Examiner* — Kee M Tung
*Assistant Examiner* — Zhengxi Liu
(74) *Attorney, Agent, or Firm* — Westerman, Hattori, Daniels & Adrian, LLP

(57) ABSTRACT

When an interpolation point is interpolated using a curve/curved surface, represented by control points, such as a B-Spline curve/curved surface or a subdivision surface, interpolation processing is performed in such a way that a moving vector for moving each control point is calculated using position information on interpolation points constituting the point group, as well as vector information on the unit direction vector that is set for each interpolation point, and the control point is moved in the movement direction and for the movement amount of this moving vector. By, repeating the generation step of a curve/curved surface that interpolates the interpolation point and the movement step of the control point, the position of a new control point is found that fits the curve/curved surface to the positions and the unit direction vectors of the point group.

12 Claims, 13 Drawing Sheets

OTHER PUBLICATIONS

Lin H, Wang G, Dong C. Constructing iterative non-uniform B-spline curve and surface to fit data points. Science in China 2004;47(3):315_31.*

Fan F, Cheng F, Lai S. Subdivision based interpolation with shape control. Computer Aided Design and Application 2008;5(1-4):539-47.*

Notification of Transmittal of Translation of the International Preliminary Report on Patentability (Form PCT/IB/338) of International Application No. PCT/JP2008/069306 mailed Jun. 10, 2010 with Forms PCT/IB/373 and PCT/ISA/237.

International Search Report of PCT/JP2008/069306, mailing date of Dec. 16. 2008.

L. Piegl et al. "The NURBS Book", Springer-Verlag Berlin Heidenberg, 1995 and 1997, pp. 373-376.

Written Opinion in PCT/JP2008/069306, mailing date of Dec. 16, 2008.

Notification Concerning Transmittal of International Preliminary Report on Patentability (PCT Form IB/326), of International Application No. PCT/JP2008/069306 mailed on May 14, 2010 with Forms PCT/IB/373 and PCT/ISA/237.

* cited by examiner (S3a)

(S3b)

(S3c)

INTERPOLATION POINT (S3c)

(S3c)

BUWDITCH CURVE

INPUT POINTS AND NORMAL VECTOR

INTERPOLATED CURVE

TROCHOID CURVE

INPUT POINTS AND NORMAL VECTORS

INTERPOLATED CURVE

INTERPOLATION OF
PRESENT INVENTION

CONVENTIONAL METHOD

CONVENTIONAL METHOD
(HERMITE INTERPOLATION)

INTERPOLATION OF
PRESENT INVENTION

CONVENTIONAL METHOD
(HERMITE INTERPOLATION)

INTERPOLATION PROCESSING METHOD AND INTERPOLATION PROCESSOR

TECHNICAL FIELD

The present invention relates to fitting processing method and a fitting processor for generating a curve and a curved surface by interpolating and approximating point group data, and to a program for causing a CPU to perform the fitting processing.

BACKGROUND ART

A free-form surface, which is used for the body of various industrial products such as a ship, a car, and an airplane, combines functionality with beauty, and is used for the design engineering of home electrical appliances and many other consumer products that require good form.

Recently, a 3D laser scanner collects high-density point group data speedily and easily, allowing an object shape to be measured accurately. For example, in the field of 3D modeling, a mock-up model manually created by a designer is measured by a 3D laser scanner to create CAD data, such as curved surface data necessary for producing products, based on the point group data and polygon data captured by a computer. This is the so-called the reverse engineering technique for a shape.

In general, a 3D model is represented on a computer using a polygon model or curved surface patches such as NURBS and B-Spline.

In CAD/CAM, curve/curved surface interpolation and approximation methods based on the point group position information, such as B-Spline, NURBS, and subdivision, are known (Non-Patent Document 1, Patent Document 1). In interpolation and approximation, the normal line information may be used, in addition to the position information on points, to increase design flexibility and to increase the approximation accuracy of an offset curve/curved surface.

No-Patent Document 1: Les Piegel, Wayne Tiller "The NURBS Book" P373-P376 Springer-Verlag Berlin Heidenberg 1995 and 1997
Patent Document 1: Japanese Patent Laid-Open Publication No. 2004-192209

DISCLOSURE OF THE INVENTION

Problems to be Solved by the Invention

In interpolation in which a normal line is used, more control points are used than are used for interpolating only the positions of a point group. For example, the number of control points is about two times the number of interpolation points for a curve, and about three times the number of interpolation points for a curved surface.

In addition, for the tangent vector used for specifying a normal line, the information on the direction as well as the information on the magnitude must be specified for each interpolation point. The specification of the magnitude of the tangent vector requires the user to manually repeat the specification of the magnitude of the tangent vector at each interpolation point and the evaluation of the interpolation result of a curve or a curved surface obtained according to the specified magnitude, thus resulting in long, heavy-load interpolation processing.

As a result, the problem with the interpolation processing in which the point group position information as well as the normal line information is specified is that the number of data pieces that must be set is increased because more control points are used and the direction and the magnitude of a tangent vector must be specified. This increase in the number of data pieces results an increase in the operation processing time and in the amount of manual processing.

Another problem is that an increase in the number of control points sometimes causes unwanted vibration in a curve.

In view of the foregoing, it is an object of the present invention to solve the problems of the prior art described above. More specifically, an object of the present invention is to reduce the data amount of processing data used for the interpolation processing in which point group position information and normal line information are used.

More specifically, it is an object of the present invention to suppress an increase in the number of control points, and to eliminate the need for specifying the magnitude of a tangent vector, in the interpolation processing in which the point group position information and the normal line information are used.

Means to Solve the Problems

The present invention starts in a state in which a point group to be used for fitting is received and finds a curve or a curved surface that interpolates the point group. First, with the point group to be used for fitting as an initial control point group, a curve or a curved surface is generated using the control points of this control point group. A B-Spline curve may be applied to the curve represented by the control points, and a B-Spline curved surface or a subdivision curved surface may be applied to the curved surface represented by the control points.

After that, with the same point group as the interpolation points, the control points obtained when the curve or the curved surface is generated are moved to interpolate the interpolation points using the generated curve or curved surface. In the description below, a curve or a curved surface denoted as a curve/curved surface.

When interpolation points are interpolated using a generated curve/curved surface in the interpolation processing of the present invention, a moving vector for moving each control point is calculated using position information on interpolation points constituting the point group as well as vector information on the unit direction vector that is set for each interpolation point, and the control point is moved in the movement direction and for the movement amount of this moving vector.

By repeating the generation step of the curve/curved surface that interpolates the interpolation points and the movement step of the control points, the positions of new control points are found that fit the curve/curved surface to the positions and the unit direction vectors of the point group.

The present invention repeats a first step of finding a point on a curve/curved surface nearest to each point of the point group, a second step of finding a point where the tangent on the curve/curved surface perpendicular to the pre-set unit direction vector touches curve/curved surface, and a third step of finding a vector going from the point found in the second step to the points and moving each control point by the vector, until the position error and the angular error for the position and the direction defined for each interpolation point becomes smaller than a predetermined value.

A position error is decreased by repeating the steps until the distance between each point of the point group and the curve/curved surface satisfies or becomes smaller than a threshold. An angular error is decreased by repeating the steps until the angular difference between the normal vector at the point on the curve/curved surface and nearest to the point group and the unit direction vector that is set for the interpolation point satisfies or becomes smaller than a threshold. By doing so, a curve/curved surface that fits the point group is generated.

The present invention provides an interpolation processing method in one aspect, and an interpolation processor in another aspect.

In the aspect of an interpolation processing method, there is provided an interpolation method for interpolating a point group using a curve or a curved surface defined by control points wherein the point group has position information on each of interpolation points and vector information on the unit direction vector that defines the direction of the curve or the curved surface at the interpolation point.

The interpolation processing comprises a first interpolation step of performing a geometry algorithm operation for finding a first point on a curve/curved surface defined by control points based on the position information on each interpolation point, the first point being the foot of a perpendicular line dropped from the interpolation point onto the curve or the curved surface; a second interpolation step of performing a geometry algorithm operation for finding a second point based on the vector information, the second point being the point of contact between the tangent of the curve and the curve or between the tangent plane of the curved surface and the curved surface, the tangent or the tangent plane being perpendicular to the unit direction vector; and a third interpolation step of performing a geometry algorithm operation for finding a vector going from the first point to the interpolation point, a vector going from the second point to the interpolation point, and a vector going from the second point to the first point as moving vectors and for moving the position of a control point, which defines the curve or the curved surface, using one moving vector, selected from the three moving vectors, for determining a moved position as the position of the control point of a new curve or a new curved surface. The operation processing for performing the interpolation steps is carried out by operation means in which the geometry algorithms are included.

In the aspect of an interpolation processor, there is provided an interpolation processor for interpolating a point group using a curve or a curved surface defined by control points wherein the point group has position information on each of interpolation points and vector information on the unit direction vector that defines the direction and curvature of the curve or the curved surface at the interpolation point.

The interpolation processor comprises first to third geometry operation means as the configuration for performing interpolation processing.

The first geometry operation means performs a first interpolation step according to a geometry algorithm for finding a first point on the curve or the curved surface defined by control points based on the position information on each interpolation point, the first point being the foot of a perpendicular line dropped from the interpolation point onto the curve or the curved surface.

The second geometry operation means performs a second interpolation step according to a geometry algorithm for finding a second point based on the vector information, said second point being a point of contact between the tangent of the curve and the curve or between the tangent plane of the curved surface and the curved surface, said tangent or said tangent plane being perpendicular to the unit direction vector.

The third geometry operation means performs a third interpolation step according to a geometry algorithm for finding a vector going from the first point to the interpolation point, a vector going from the second point to the interpolation point, and a vector going from the second point to the first point as moving vectors and for moving the position of a control point, which defines the curve or the curved surface, using one of the moving vectors for determining a moved position as the position of the control point of a new curve or a new curved surface.

The first geometry operation means, second geometry operation means, and third geometry operation means each have a CPU and a storage device for executing the geometry algorithm via software and a circuit for executing the geometry algorithm via hardware.

In the present invention, the unit direction vector that defines the direction and curvature of a curve/curved surface has the direction information only but not the magnitude information. The unit direction vector may be a normal vector at an interpolation point on a curve or a curved surface, which interpolates interpolation points, or may be a direction vector having a predetermined angular relation with the normal vector.

For the interpolation processing to end, the steps are repeated until it is judged that the curve/curved surface has interpolated the interpolation points sufficiently. The convergence of this repetition is determined with the distance and the angular difference as the index.

When the steps are repeated with the distance as the index, the interpolation processing comprises the steps of finding a new curve/curved surface based on the control point obtained in the operation processing; comparing a distance between the interpolation point and the found curve or curved surface with a threshold; and repeating the first interpolation step, second interpolation step, and third interpolation step until the distance satisfies or becomes smaller than the threshold.

When the steps are repeated with the angle as the index, the interpolation processing comprises the steps of finding a new curve/curved surface based on the control point obtained in the operation processing; finding an angular difference formed between the unit direction vector that is set at each interpolation point and a normal vector on the curve or curved surface at the first point that is the foot of the perpendicular line obtained in the first interpolation step; comparing between the angular difference in the vectors with a threshold; and repeating the first interpolation step, second interpolation step, and third interpolation step until the angular difference satisfies or becomes smaller than the threshold.

The convergence with the distance as the index and the convergence with the angular difference as the index may be performed singly or in combination.

When the interpolation processing of the present invention is started with a point group given, a curve/curved surface is generated with the interpolation points of the given point group as the initial control points in the interpolation steps that are performed for the first time and the control points are generated by performing the geometry algorithm operations. Next, in the interpolation steps that are performed for the second and subsequent times, the geometry algorithm operations are performed and each control point is corrected with the position of each control point determined in the interpolation steps as the position of a new control point and this processing is repeated.

The interpolation processing of the present invention, in which each control point is processed locally, does not require a linear system and generates a curve/curved surface that fits a point group only through geometrical processes. Therefore, the interpolation processing of the present invention reduces the number of control points, which define a curve/curved surface, by one-half for a curve, and by one-third for a curved surface, as compared with a conventional method.

In addition, in the interpolation processing of the present invention, the unit direction vector that is set for an interpolation point includes only the direction, but not the magnitude, as the vector information. In contrast, the processing in which a tangent vector is used as in the conventional method requires the user to change the magnitude of the tangent vector at each print on a curve or a curved surface while visually checking the form of the curve or the curved surface for fitting them to the point group, requiring much labor and long time. The present invention allows for curve/curved line fitting without human intervention from the start to the end of the process. Fitting refers to both interpolation and approximation.

Effects of the Invention

As described above, the present invention suppresses an increase in the number of control points and reduces the data amount of processing data in the interpolation processing that uses position information and normal line information specified by a point group.

The present invention eliminates the need for specifying the magnitude of a tangent vector in the interpolation processing that uses position information and normal line information specified by a point group, making the automatic interpolation easy.

The present invention suppresses unwanted vibrations at interpolation time that are generated as more control points are used.

EXPLANATIONS OF SYMBOLS

| | |
|---|---|
| 1 | Input means |
| 2 | Storage means |
| 2a | Data storage unit |
| 2b | Operation tool program storage unit |
| 2c | Operation processing program storage unit |
| 2d | Primary storage unit |
| 2e | Operation result storage unit |
| 3 | Operation means |
| 4 | Display means |
| 5 | Output means |

BEST MODE FOR CARRYING OUT THE INVENTION

A preferred embodiment of the present invention will be described in detail below with reference to the drawings. Although the following primarily describes B-Spline curves/curved surfaces as curves/curved surface defined by control points, the present invention is not limited to B-Spline curves/curved surfaces but may be applied also to curves/curved surfaces, such as subdivision surfaces, that are represented using control points.

Figure 1:
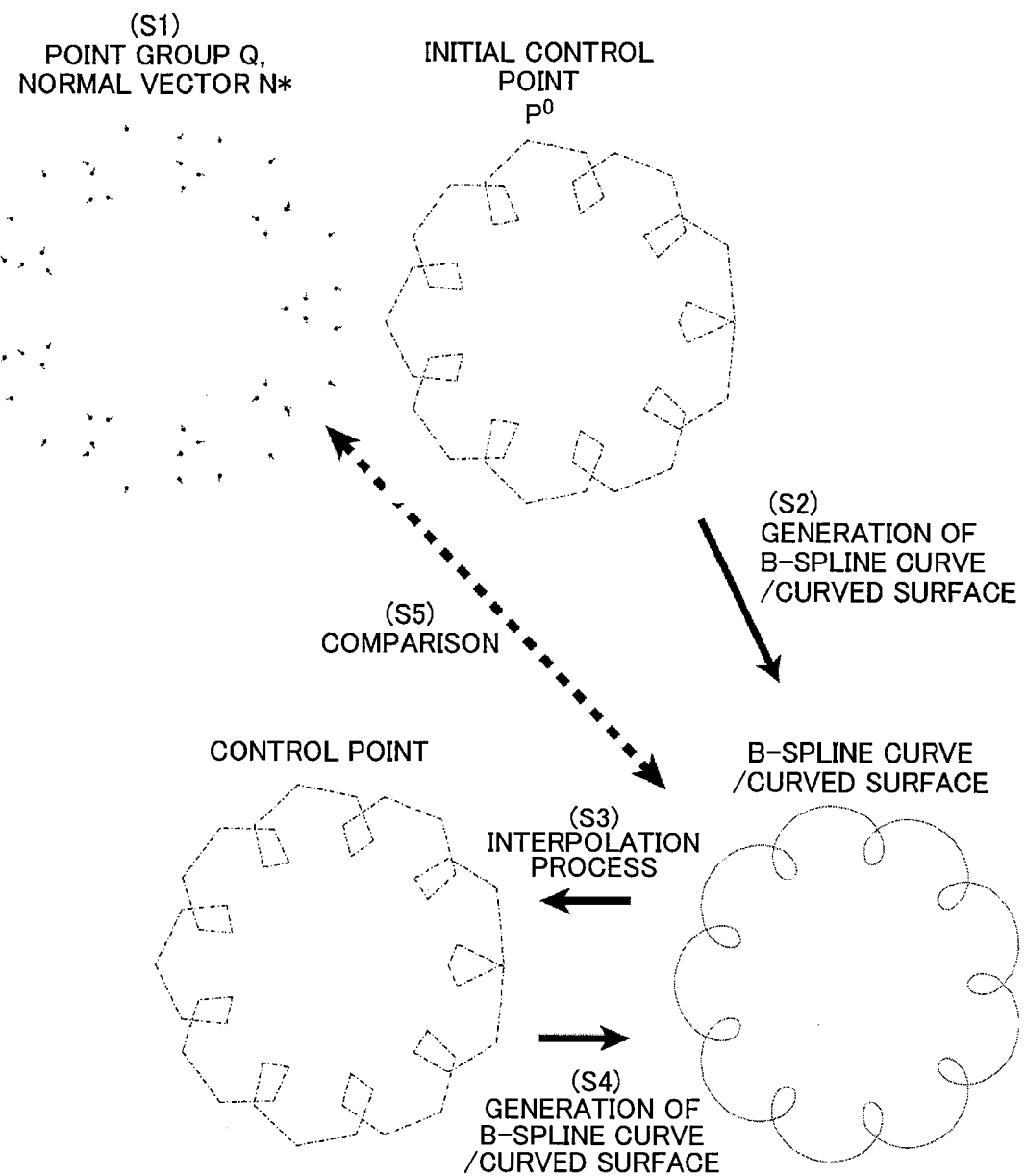
FIG. 1 is a general diagram showing the outline of the interpolation processing of the present invention.
Figure 2:
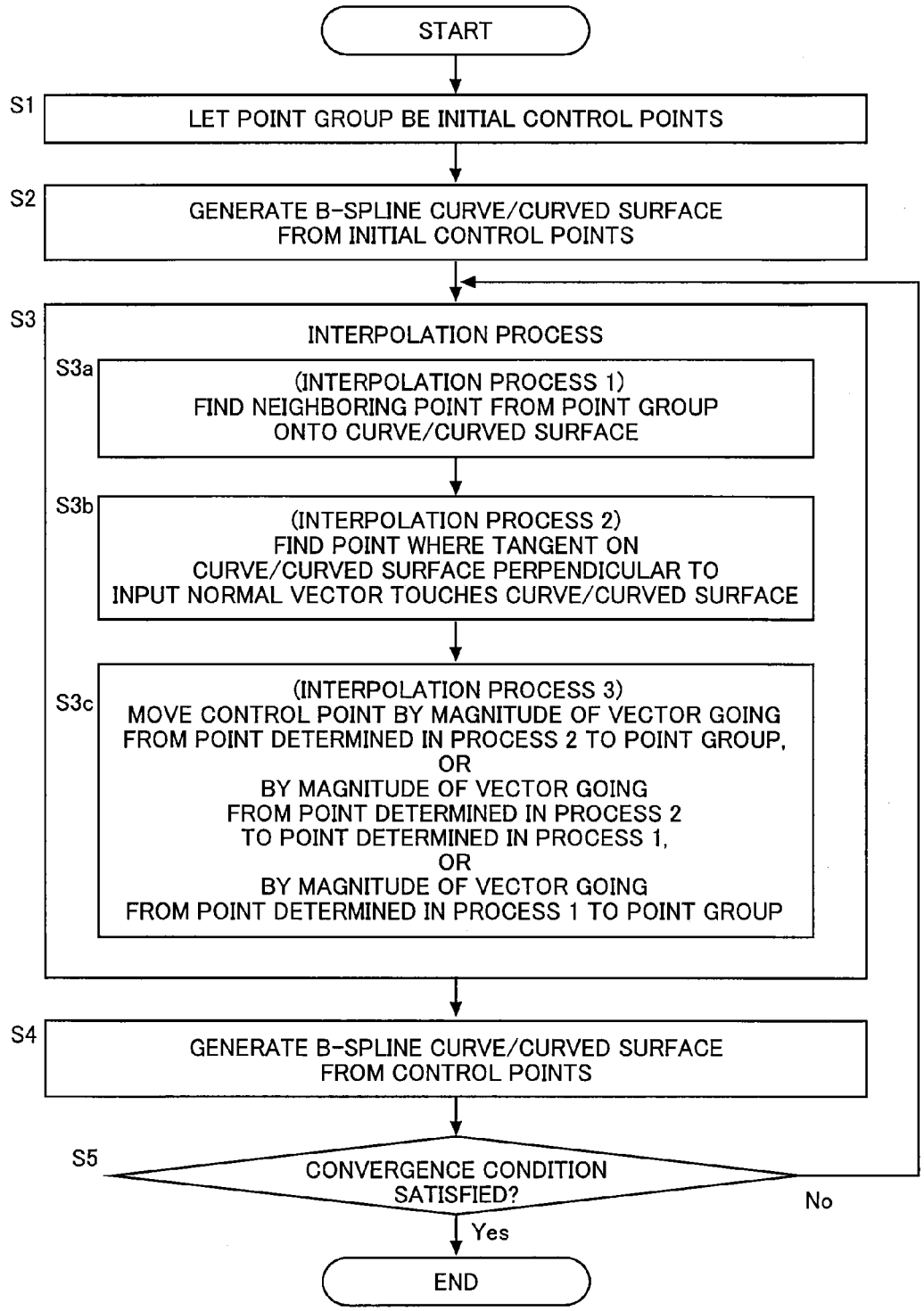
FIG. 2 is a flowchart showing the outline of the interpolation processing of the present invention.

FIG. 1 is a general diagram showing the interpolation processing of the present invention, FIG. 2 is a flowchart showing the interpolation processing of the present invention, FIG. 3 and FIG. 4 are diagrams showing the interpolation processing of the present invention. FIG. 5 is a general configuration diagram showing an interpolation processor of the present invention.

FIG. 1, FIG. 2, FIG. 3, and FIG. 4 generally show the procedure for finding a B-Spline curve from a given point group Q that includes the position information and the vector information on the unit direction vector. The following describes an example of a normal vector as a unit direction vector. When the unit direction vector is a non-normal vector, the direction may be determined by specifying a predetermined angular relation for the normal vector.

In the description below, a point group for which interpolation is to be performed is called simply a point group, and a normal vector given to each point group at input time is called simply a normal vector.

Although the following primarily describes a curve, the description applies also to a curved surface.

The following describes the procedure for generating a B-Spline curve/curved surface from a given point group Q with reference to the general diagram in FIG. 1 and the flowchart in FIG. 2.

First, let the given point group Q be the initial control points $P^0$. The point group Q includes the position information on the points and the direction information specified for the points. The direction information, which defines the direction and the curvature of a curve or a curved surface that interpolates the point group, may be represented by a unit direction vector. The unit direction vector has the direction information only but does not have the magnitude information. The unit direction vector may be, for example, a normal vector at that point or may be a vector having a predetermined angular relation with the normal vector. In the description below, a normal line is used as an example of the unit direction vector. The left half of the part indicated by (S1) in FIG. 1 indicates the point group Q and the normal vectors N* (represented as the arrow above the symbol N in the figure) at the corresponding positions, and the right half indicates a shape generated by joining the initial control points by a straight line where the point group Q is composed of the initial control points (S1).

Because the control points are not set when the B-Spline curve/curved surface is generated for the first time, the given point group is used as the initial control points and, based on the initial control points, the B-Spline curve $C^0$ is generated. In FIG. 1, the arrow (S2) indicates the state in which the B-Spline curve/curved surface is generated from the shape formed by joining the initial control points (S2).

Next, the control points are moved through the interpolation processing, and a B-Spline curve/curved surface is formed that passes through the interpolation points more exactly.

This interpolation processing is performed in such a way that the moving vectors are generated from the relation between the points on the B-Spline curve/curved surface and the interpolation points and, using the generated moving vectors, the positions of the control points are moved. More specifically, the three interpolation steps, (S3a)-(S3c) are performed as will be described later. The arrow (S3) in FIG. 1 indicates the state in which new control points are calculated by the interpolation step (S3).

After moving the positions of the control points by the interpolation processing in S3, the B-Spline curve $C''$ is generated based on the moved control points. In FIG. 1, the arrow (S4) indicates the state in which the B-Spline curve/curved surface is generated using the moved control points (S4).

The generated B-Spline curve/curved surface and the point group Q are compared, and the interpolation processing in S3 is repeated until the B-Spline curve/curved surface interpolates the point group Q satisfactorily. The interpolation processing in S3 is repeated until the distance error between the points of the point group Q and the points on the B-Spline curve/curved surface corresponding to the point group Q is converged and until the angular difference between the normal vectors of the points of the point group Q and the normal lines of the points on the B-Spline curve/curved surface corresponding to the point group Q is converged. This convergence is performed by repeating the step of S3 until the distance error and the normal line angular difference satisfy the threshold.

The convergence of the B-Spline curve/curved surface described above may be judged by using two convergence conditions, that is, the convergence condition for the distance error between points and the convergence condition for the angular difference between normal lines, or by using one of those convergence conditions (S5).

The following describes the interpolation processing in S3 described above. The interpolation processing in S3 has three interpolation steps, S3a, S3b, and S3c.

In the first interpolation step S3a, the foot of the perpendicular line dropped from an interpolation point to the B-Spline curve/curved surface is found. The foot of the perpendicular line may be determined as the point on the B-Spline curve/curved surface that is shortest from the interpolation point.

In the second interpolation step S3b, when the normal vector given to each interpolation point and a tangent or a tangent plane on the B-Spline curve/curved surface are perpendicular, the point of contact on the curve/curved surface having such a tangent or a tangent plane is found.

In the third interpolation step S3c, the vector is found that is formed between the point on the B-Spline curve/curved surface, which was found by the first interpolation step and the second interpolation step, and the interpolation point and, with the resulting vector as the moving vector, the position of the control point is moved to set a new control point.

The following describes the interpolation processing in S3 with reference to FIG. 3 and FIG. 4.

Figure 3A:
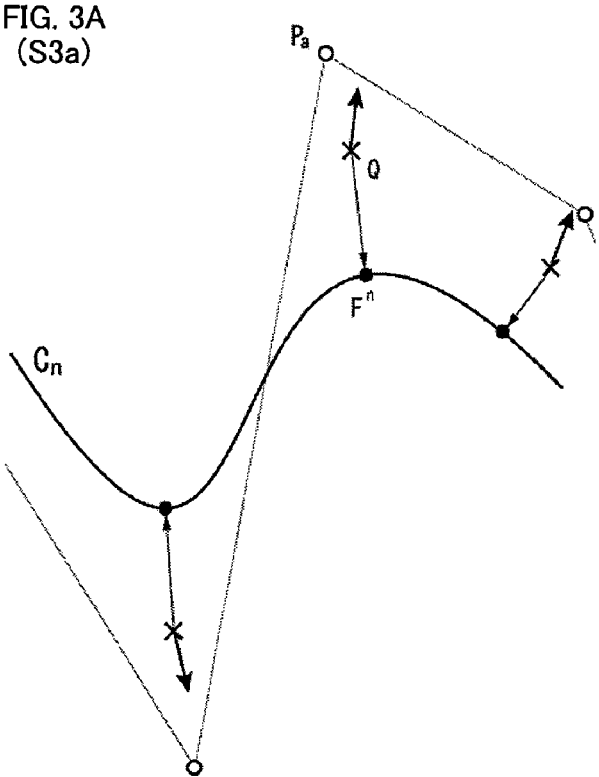
FIG. 3 is a diagram showing first and second interpolation steps of the interpolation processing of the present invention.
Figure 3B:
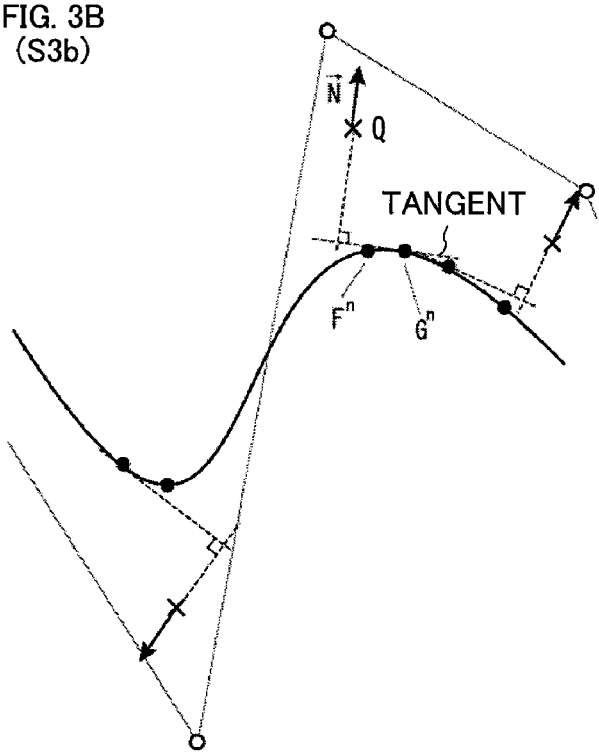

FIG. 3A is a diagram showing the step of the first interpolation step S3a, FIG. 3B is a diagram showing the step of the second interpolation step S3b, and FIG. 4 is a diagram showing the step of the third interpolation step S3c.

In FIGS. 3 and 4, the control point before the shift is indicated by $P^a$, the control point after the shift is indicated by $P^b$, and the neighboring point found on the curve $C''$ is indicated by $F''$. The normal vector is indicated by N* (represented as the arrow above the symbol N in the figure), and the point on the curve $C''$ having the tangent perpendicular to the normal vector N* is indicated by $G''$. The following describes the steps using a B-Spline curve.

In the first interpolation step S3a shown in FIG. 3A, the control point $P^a$ is the point at the same position as that of the interpolation Q of the given point group in the first interpolation step and, in the second and subsequent interpolation steps, is the control point that has its position shifted by the previous interpolation step.

In the first interpolation step S3a, the geometry algorithm operation processing is performed to find the first point $F''$ on the B-Spline curve $C''$, defined by the control points, based the position information on the interpolation point Q. This first point $F''$ is the foot of the perpendicular line dropped from the interpolation point Q onto the B-Spline curve $C''$.

Next, in the second interpolation step S3b shown in FIG. 3B, the normal vector N* is given to each point group Q.

In the second interpolation step S3b, the point of contact on the curve having the tangent perpendicular to the normal vector N* is found near $F''$, and the resulting point of contact is set as the second point $G''$. In the case of a curved surface, the geometry algorithm operation is performed to find the second point $G''$ that is the point of contact between the curved surface and the tangent plane of the curved surface perpendicular to the normal vector.

FIG. 4 shows three examples of control point moving modes used in the third interpolation step S3c.

In the third interpolation step S3c, a vector is found among the first $F''$ determined by the first interpolation step, the second point $G''$ determined by the second interpolation step, and the interpolation point Q and, using the resulting vector as the moving vector, the position of the control point is moved to set a new control point.

Figure 4A:
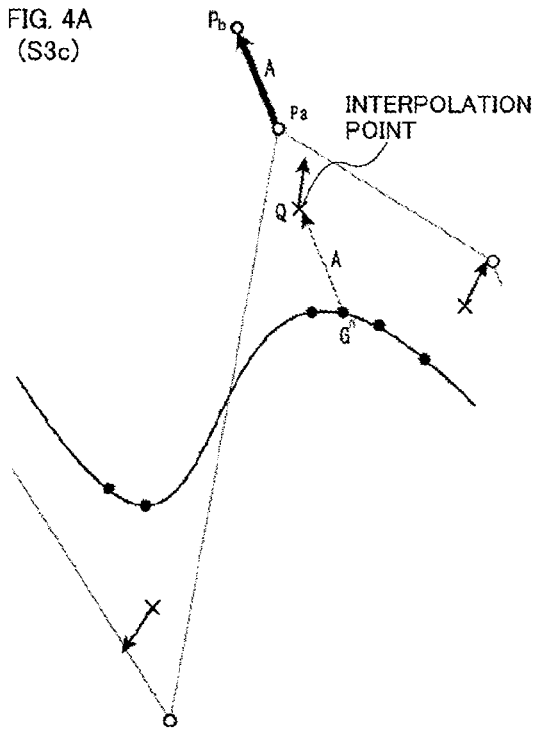
FIG. 4 is a diagram showing a third interpolation step of the interpolation processing of the present invention.
Figure 4B:
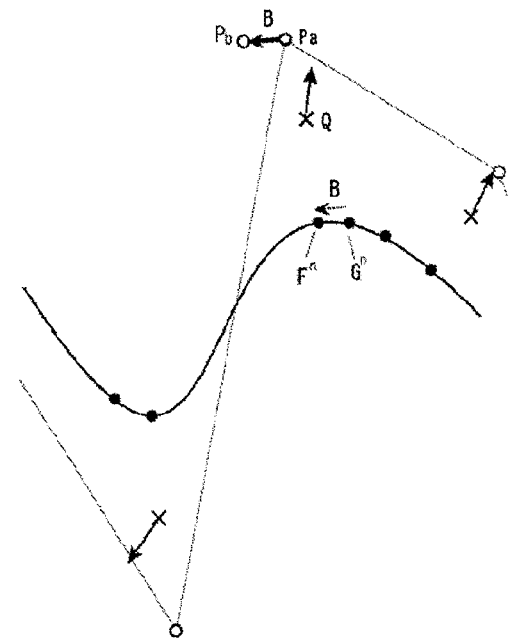
Figure 4C:
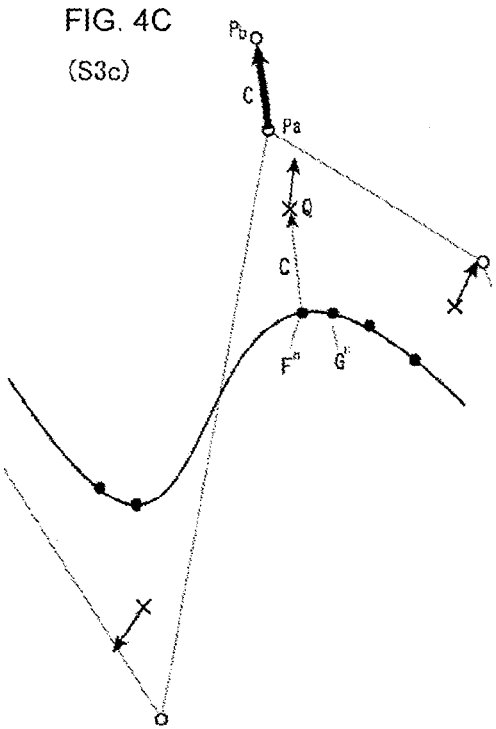
Figure 5:
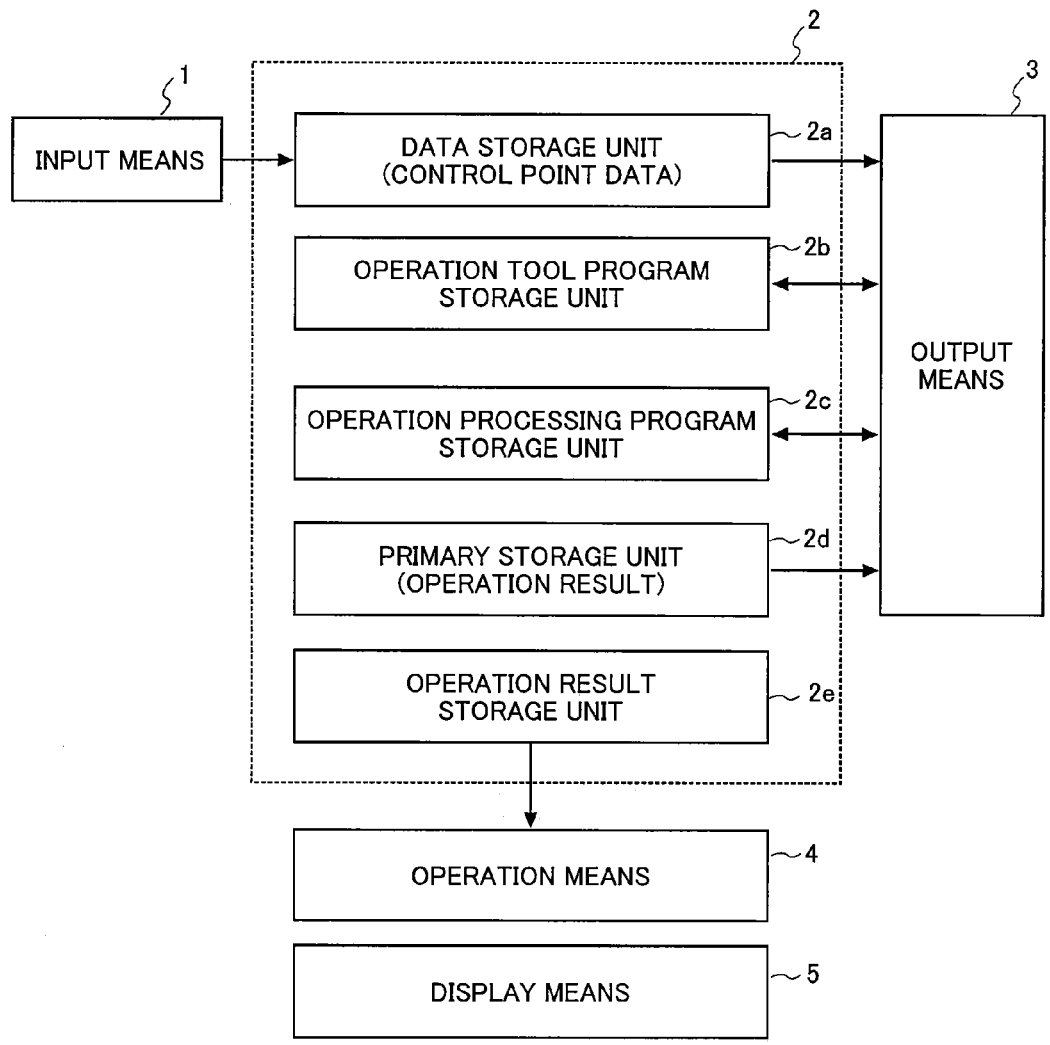
FIG. 5 is a general configuration diagram showing an interpolation processor of the present invention.

FIG. 4A shows the moving mode in which the control point P is moved with the vector from the second point $G''$ to the interpolation point Q as the moving vector, FIG. 4B shows the moving mode in which the control point P is moved with the vector from the second point $G''$ to the first point $F''$ as the moving vector, and FIG. 4C shows the moving mode in which the control point P is moved with the vector from the first point $F''$ to the interpolation point Q as the moving vector.

In the third interpolation step S3c, the control point is moved using one of moving vectors in the moving modes to find a new control point. This third interpolation step is performed by the geometry algorithm operation, and this operation processing may be performed by operation means in which the geometry algorithm is incorporated.

Next, the third interpolation step in which the position of the control point $P^a$ is shifted to determine the control point $P^b$ at a new position is performed as follows. In the moving mode shown in FIG. 4A, the vector A (indicated by the broken line in the figure) going from the second point $G''$, obtained in the second interpolation step S3b, to the corresponding interpolation point Q is determined and, with this vector A as the moving vector, the control point $P^a$ is moved to find a new control point $P^b$.

In the moving mode shown in FIG. 4B, the vector B (indicated by the broken line in the figure) going from the second point $G''$, obtained in the second interpolation step S3b, to the first point $F''$ obtained in the first interpolation processing S3a is determined and, with this vector B as the moving vector, the control point $P^a$ is moved to find a new control point $P^b$.

In the moving mode shown in FIG. 4C, the vector C (indicated by the broken line in the figure) going from the first point $F''$, obtained in the first interpolation step S3a, to the corresponding interpolation point Q is determined and, with this vector C as the moving vector, the control point $P^a$ is moved to find a new control point $P^b$.

One of the three moving modes is selected to move the control point and to find the position of a new control point. The position to which the control point is to be moved is selected as follows.

When the interpolation processing shown in FIG. 4A for shifting the control point to a position by the magnitude of the vector going from the second point $G''$ to the corresponding interpolation point Q is repeated and, as a result, the distance error between the interpolation point Q and the curve $C''$ becomes short, the angular difference in the normal vectors sometimes does not decrease even when the control point $P^a$ is moved.

In such a case, the angular difference may be decreased by shifting the control point $P^a$ to a position by the magnitude of the vector going from the second point $G''$ to the first point $F''$ as shown in FIG. 4B.

Conversely, when the angular difference becomes small enough and, as a result, the distance error is not decreased even if the control point P is shifted, the distance error is decreased by shifting the control point to a position by the magnitude of the vector going from the first point $F''$ to the interpolation point Q. Any of the moving modes may be selected according to the situation.

The interpolation processing S3 is performed by repeating the first interpolation step S3a, the second interpolation step S3b, and the third interpolation step S3c. A B-Spline curve/curved surface is generated in the step S4 described above by using the control point $P^b$ obtained in the third step.

In the step S5, the generated B-Spline curve/curved surface is compared with the point group in distance and in normal vector, and the interpolation step S3 is repeated until the distance error between the corresponding points or the angular difference between the corresponding normal vectors is converged. This convergence is repeated until the distance error or the normal vector angular difference satisfies the pre-set threshold or falls below the threshold.

The B-Spline curve/curved surface, produced when the distance error and the normal vector angular differences are converged by the interpolation processing, is a curve/curved surface in which the positions of interpolation points are interpolated and, at the same time, the normal vectors at the interpolation points are the same as the normal vectors that are set.

FIG. 5 is a diagram showing an example of the configuration in which the program, which stores the interpolation processing software of the present invention, is executed by a computer.

Input means 1 receives data on the point group Q and the normal vector N* and stores the received data in a data storage unit 2a in storage means 2. In addition to the data storage unit 2a, the storage means 2 comprises an operation tool program storage unit 2b that stores operation tool programs for carrying out the differential geometry operation, an operation processing program storage unit 2c that stores programs for carrying out operation processing such as the interpolation processing differential geometry operation and the B-Spline curve/curved surface generation processing, a primary storage unit 2d that temporarily stores intermediate operation results, and an operation result storage unit 2e that stores curved surface operation results obtained from the interpolation processing.

Operation means 3 perform operation according to the operation procedure, coded by the programs stored in the operation processing program storage unit 2c, using the data of the point group Q stored in the data storage unit 2a and, at the same time, serially reads operation tool programs, specified by the programs, from the operation tool program storage unit 2b for carrying out the operation processing.

The operation result stored in the operation result storage unit 2e may be read for display on display means 4 or for output to output means 5. The output means 5 may be a recording device that records the operation result on a recording medium, for example, an external device, such as a processing device, that performs a predetermined operation using the operation result.

The configuration for performing the software processing described above may be applied to a dedicated software processor or a standard personal computer.

In the configuration described above, the function carried out by the operation means including the storage means may be configured by a circuit for execution on the hardware.

Next, the following describes the detail of the interpolation processing of the present invention that is performed when a B-Spline curve is generated from a two-dimensional point group (including information on positions and normal lines) and when a B-Spline curved surface is generated from a three-dimensional point group (including information on positions and normal lines).

Figure 6:
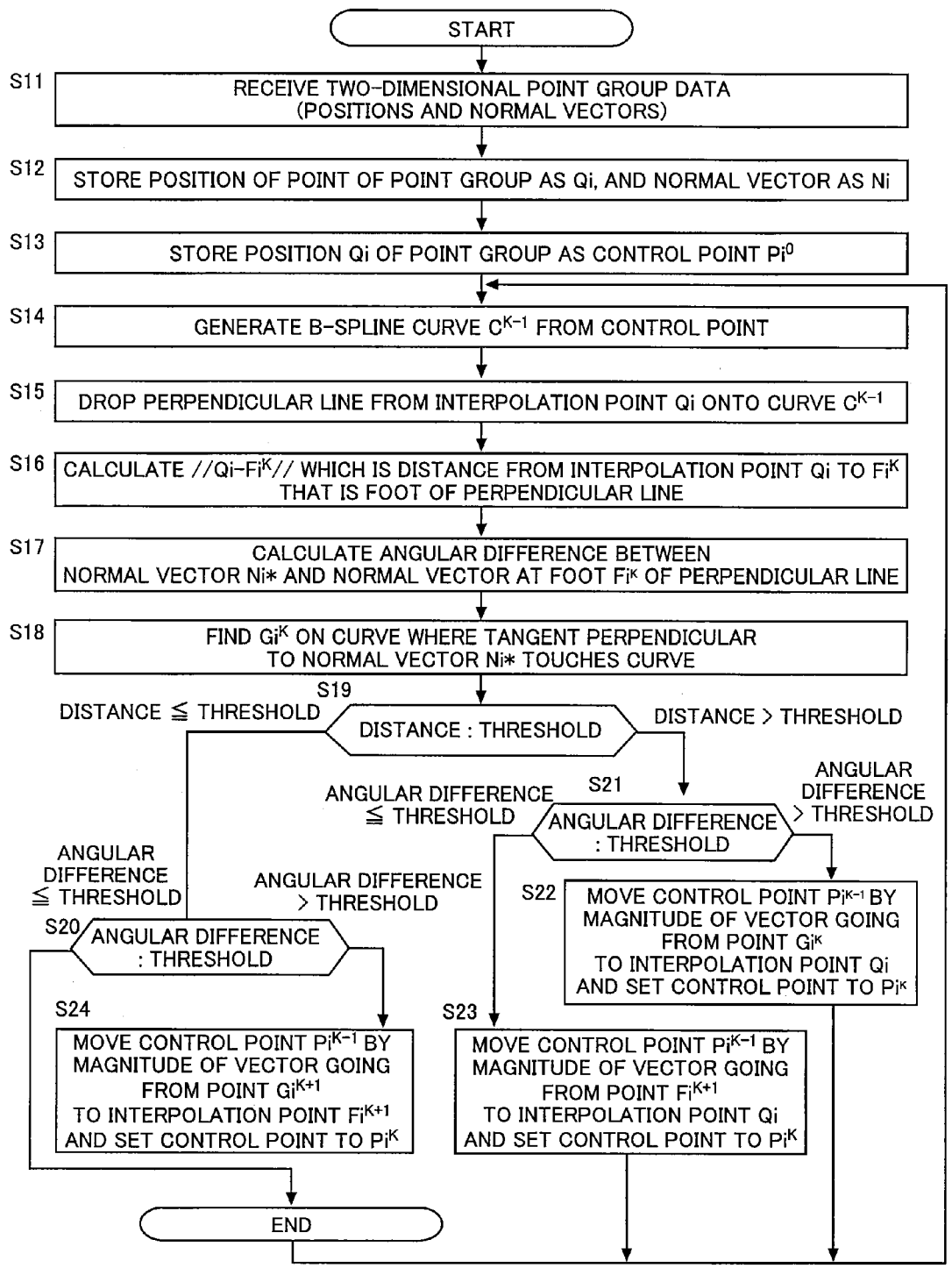
FIG. 6 is a flowchart showing the generation of a curve from a two-dimensional point group in the present invention.

First, the generation of a B-Spline curve from a two-dimensional point group (including information on positions and normal lines) will be described with reference to the flowchart in FIG. 6, the general diagrams showing the relation between control points and the curve in FIGS. 7-9, and the diagrams showing the examples of curve interpolation in FIGS. 10-12. After that, the generation of a B-Spline curved surface from a three-dimensional point group (including information on positions and normal lines) will be described with reference to the flowchart in FIG. 13.

First, the following describes the generation of a B-Spline curve from a two-dimensional point group (including information on positions and normal lines). Note that the flowchart described below is exemplary only and that any other flow may also be used if the steps and the procedure perform the first interpolation step, the second interpolation step, and the third interpolation step of the present invention.

Figure 7A:
FIG. 7 is a general diagram showing control points and a curve when the curve is generated from a two-dimensional point group in the present invention.

The two-dimensional point group data (positions and normal vectors) is received (S11), the position of a point of the point group is stored as Qi, and the normal vector is stored as N* (S12). FIG. 7A shows the state in S12. The obtained interpolation point Qi is stored as the initial control point $P^0i$ (S13).

Figure 7B:
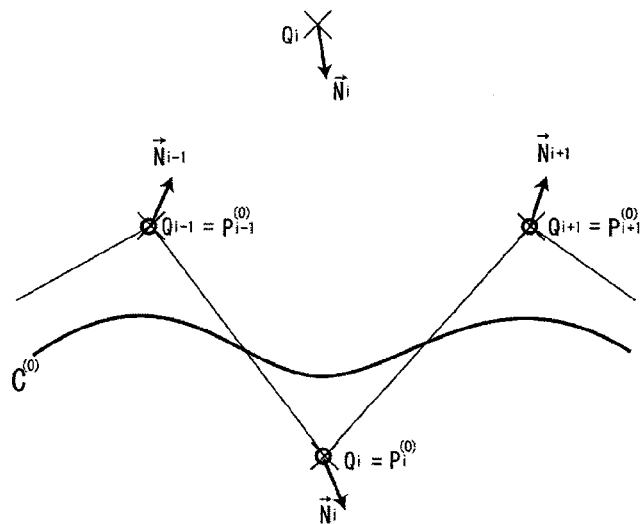

The B-Spline curve $C^{k-1}$ is generated from the control point Pk-1i. The superscript K indicates the number of times the interpolation processing is performed. Because the control point P is not set in the first processing, the given interpolation Qi is used as the initial control point $P^0i$ and, using this initial control point $P^0i$, a B-Spline curve/curved surface is generated. FIG. 7B shows the state in which the B-Spline curve/curved surface is generated using the initial control point $P^0i$ (S14).

In the subsequent processing, any of the first interpolation step shown in S15 and S16, the second interpolation step shown in S17 and S18, and the third interpolation step shown in S21-S23 is repeated to generate the B-Spline curve C that interpolates the positions and the normal vectors of the point group.

In the first interpolation step, a perpendicular line is dropped from the interpolation point Q onto the curve C, the foot of this perpendicular line is found, and the found point is set as the first point $F^ki$. The curve C on which the perpendicular line is dropped in the first processing is the curve $C^0$ generated from the control point $P^0$ obtained in the step in S13 and, in the second and subsequent processing, the curve CK generated from the control point $P^ki$ shifted in any of the steps S21-S23 (S15).

Figure 7C:
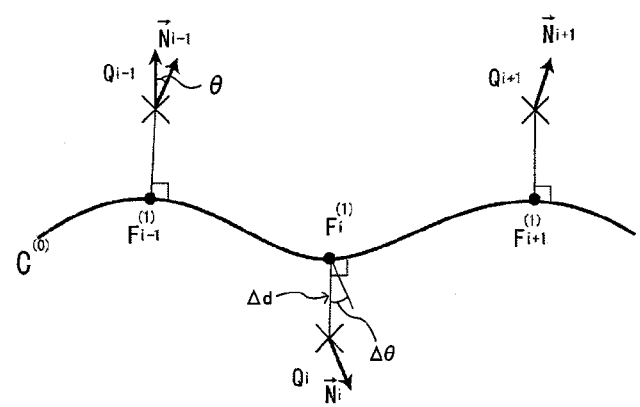

The distance, $//Qi-F^ki//(=\Delta d)$, which is the distance between the interpolation point Qi and the first point $F^Ki$ that is the foot of the perpendicular line obtained in S14, is calculated. The operation for finding the perpendicular line and the distance is performed by differential geometry operation. FIG. 7C shows the state of S15 and S16 of the first interpolation step in the first processing (S16).

Figure 7D:
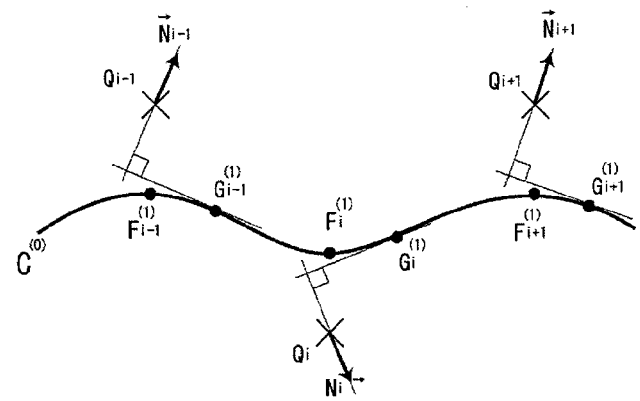

Next, in the second interpolation step, the angular difference $\Delta\theta$ is calculated between the normal vector $Ni^*$ given to each interpolation point Q and the normal vector on the curve C at the first point $F^ki$ that is the foot of the perpendicular line (S17), and the point of contact on the curve where the tangent perpendicular to the normal vector $Ni^*$ touches the curve is found as the second point $G^ki$. The angular difference and the point on the curve that touches the tangent perpendicular to the normal vector may be calculated by differential geometry operation. FIG. 7D shows the state of the interpolation step S18 that is performed in the first processing (S18).

Next, in the third interpolation step, one of the three interpolation steps S22-S24 is selected based on the distance $\Delta d$ found in S16 and the angular difference $\Delta\theta$ found in S18, and the selected step is performed.

Figure 8A:
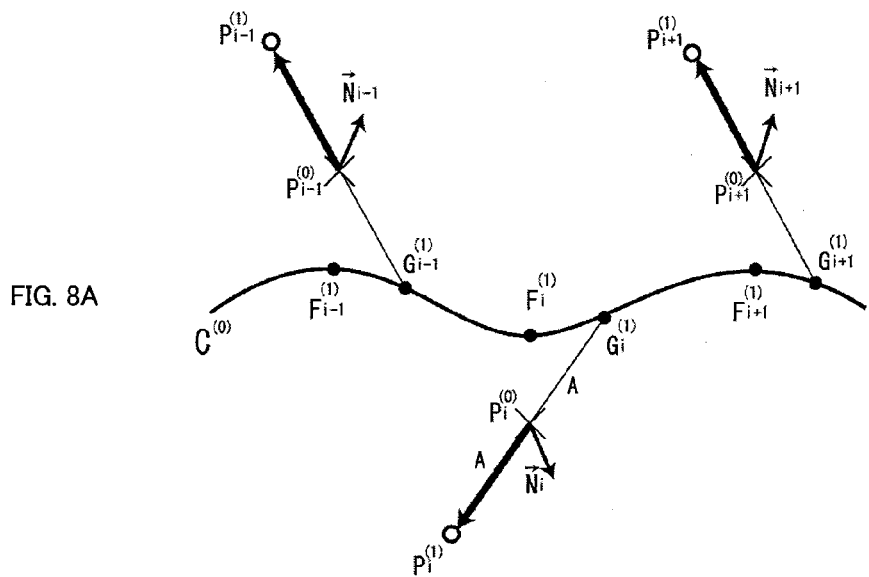
FIG. 8 is a general diagram showing control points and a curve when the curve is generated from a two-dimensional point group in the present invention.

If neither the distance error $\Delta d$ between the interpolation point and the curve nor the normal vector angular difference $\Delta\theta$ satisfy the threshold (S19, S21), the position of the control point $P^{k-1}i$ that defines the current curve is shifted in the direction and by the magnitude of the vector A going from the second point $G^ki$ on the curve found in S18 to the interpolation point Qi, and the shifted position is set to the position of the new control point $P^ki$. FIG. 8A shows the movement state in this interpolation step (S22).

Figure 8B:
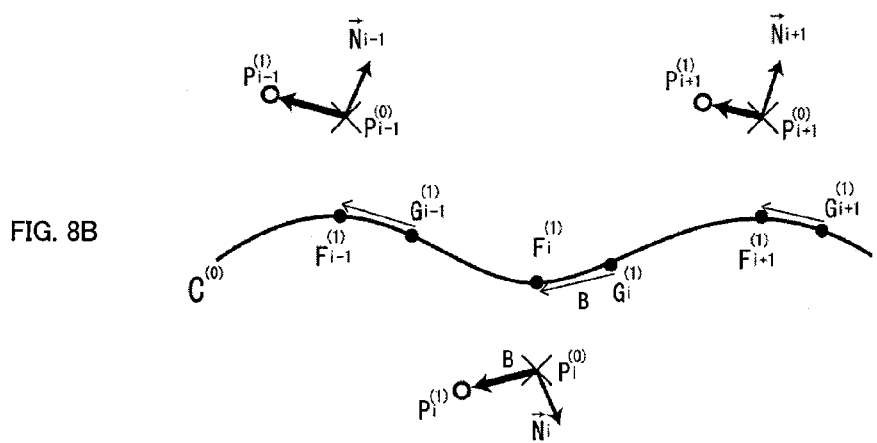

If the distance error $\Delta d$ between the interpolation point and the curve satisfies the threshold (S19) but the normal vector angular difference $\Delta\theta$ does not satisfy the threshold (S20), the position of the control point $P^{k-1}i$ that defines the current curve is shifted in the direction and by the magnitude of the vector B going from the second point $G^ki$ on the curve found in S18 to the first point $F^ki$ that is the foot of the perpendicular line found in S15, and the shifted position is set to the position of the new control point $P^ki$. FIG. 8B shows the movement state in this interpolation step (S24).

Figure 8C:
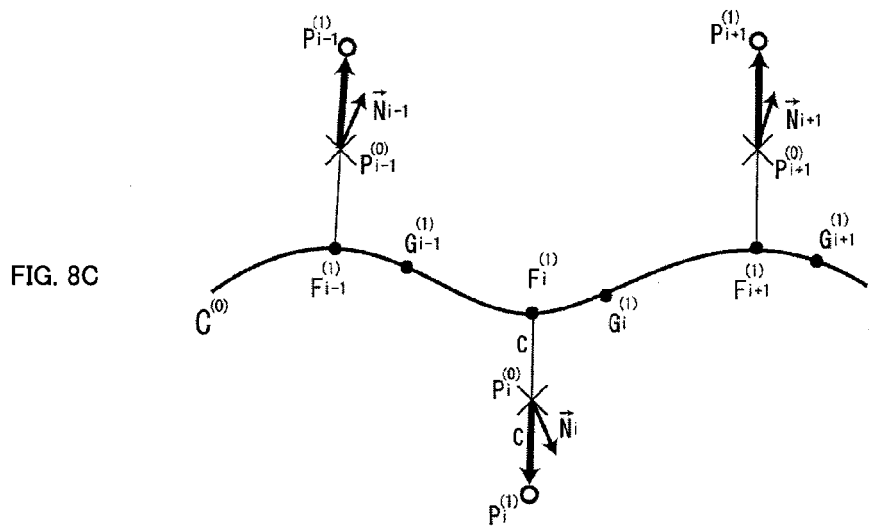

If the distance error $\Delta d$ between the interpolation point and the curve does not satisfy the threshold (S19) but the normal vector angular difference $\Delta\theta$ satisfies the threshold (S21), the position of the control point $P^{k-1}i$ that defines the current curve is shifted in the direction and by the magnitude of the vector C going from the first point $F^ki$ that is the foot of the perpendicular line found in S15 to the interpolation point Qi, and the shifted position is set to the position of the new control point $P^ki$. FIG. 8C shows the movement state in this interpolation step (S23).

The operation for shifting the control point is performed by geometry operation. FIG. 8A shows the state of S21 in the first interpolation processing, FIG. 8B shows the state of S22 in the first interpolation processing, and FIG. 8C shows the state of S23 in the first interpolation processing.

Figure 9A:
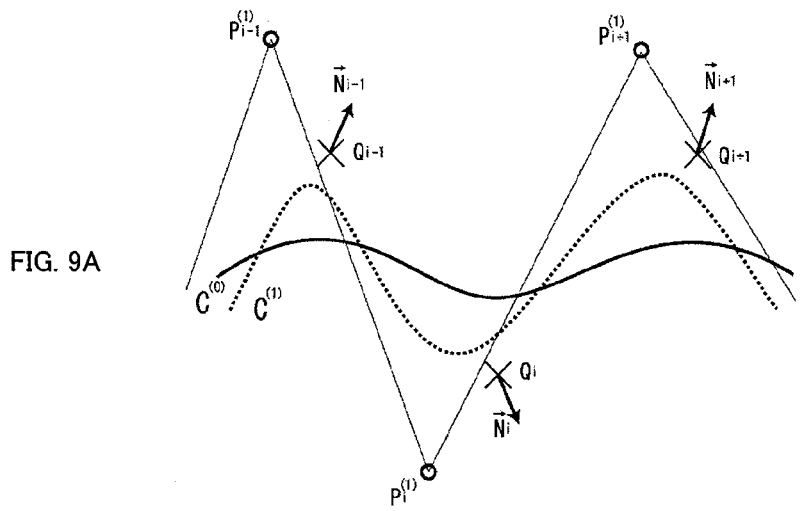
FIG. 9 is a general diagram showing control points and a curve when the curve is generated from a two-dimensional point group in the present invention.
Figure 9B:
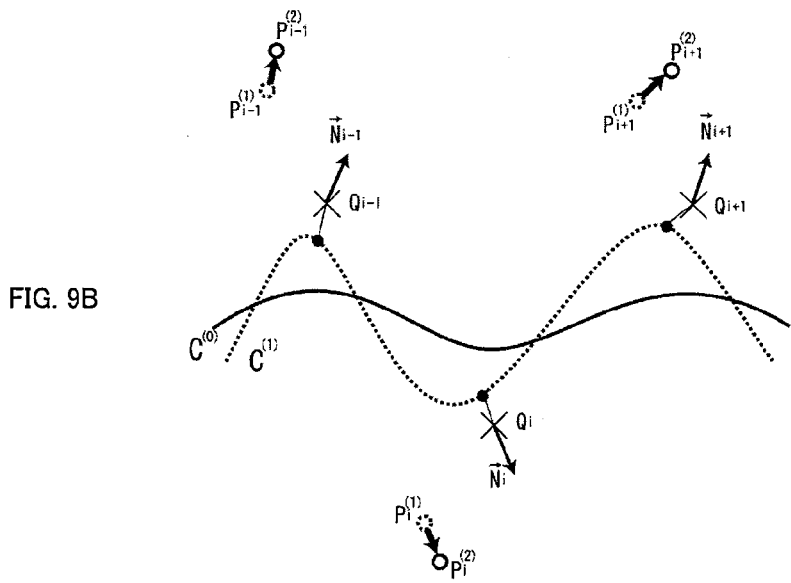
Figure 9C:
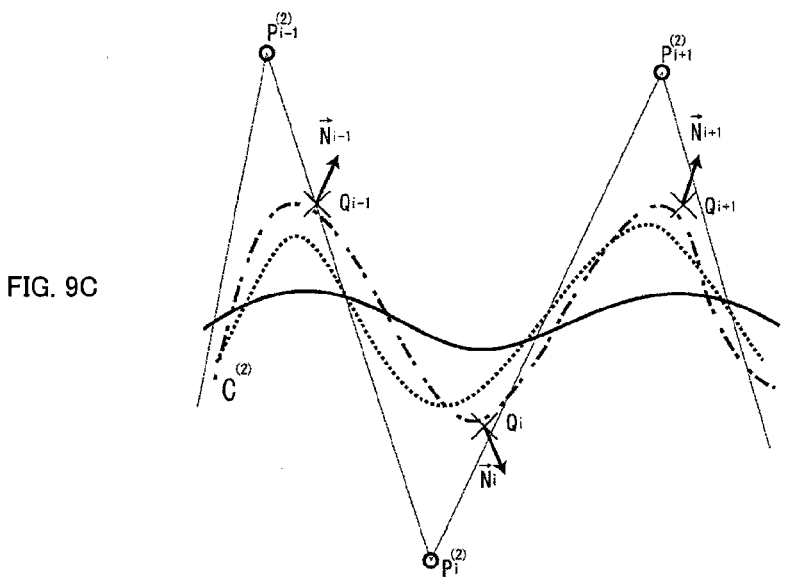
Figure 10A:
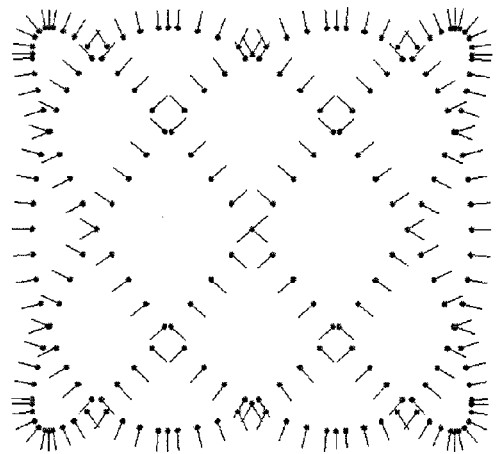
FIG. 10 is a diagram showing examples of curves that interpolate a two-dimensional point group in the present invention.
Figure 10B:
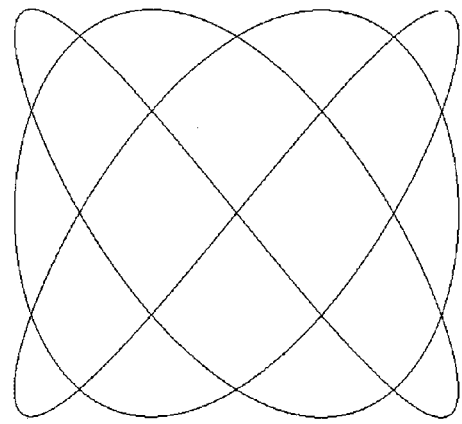
Figure 10C:
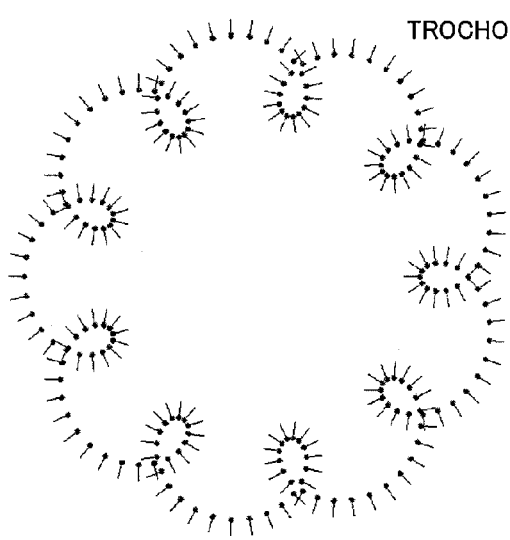
Figure 10D:
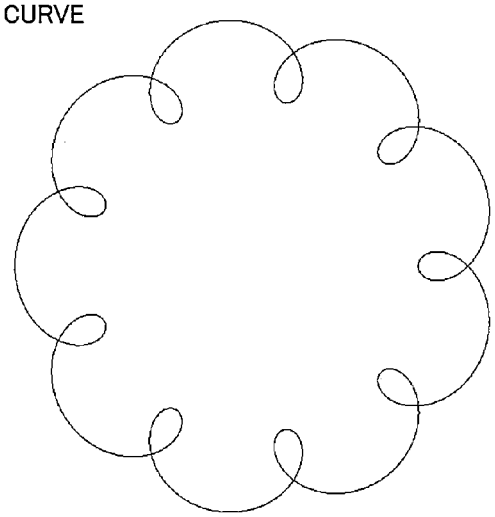

FIGS. 9A and 9C show the state in which B-Spline curves C(1) and C(2) are generated in S14 in the second and subsequent interpolation processing. FIG. 9B shows the state in which the control point P(1) is moved to the control point P(2) in S21 in the second and subsequent interpolation processing.

The steps S14-S23 are repeated until the distance error $\Delta d$ between the curve C found in S14 and the interpolation point Qi and the normal vector angular difference $\Delta\theta$ between the normal vector $Ni^*$ and the normal vector on the curve C at the first point $F^ki$ that is the foot of the perpendicular line satisfies the respective threshold. The threshold of the distance error $\Delta d$ and the threshold of the angular difference $\Delta\theta$ correspond respectively to the allowable distance error that is allowed for the curve that interpolates the point group and to the allowable normal vector angular difference that is allowed for the normal line angular difference.

Therefore, if it is confirmed that the distance and the normal vector angular difference satisfy the respective threshold in the comparison steps in S19, S20, and S21, the curve C is supposed to interpolate the positions and the normal vectors, given by the point group, in the allowable error range.

FIG. 10 is a diagram showing an example of two-dimensional (plane) curve interpolation in which the positions of the point group and the normal vectors at the points are extracted from the Bowditch curve and the Trochoid curve for interpolating the positions of the point group and the normal vectors. FIGS. 10A and 10C show the points of the point group to be interpolated and the normal vectors indicated by line segments. FIGS. 10B and 10D show the result produced respectively by interpolating the positions of the point group and the normal vectors using a cubic B-Spline curve according to the present invention.

Table 1 shows the calculation result according to the method of the present invention, and Table 2 shows the result of interpolation of only the positions of points according to the conventional method (Non-Patent Document 1). In the tables, a distance error is shown in percent with the diagonal line of the bounding box in each model as the base. The result indicates that the distance error is almost zero. For the angular difference, the maximum angular difference is about 0.024° for the Bowditch curve and about 0.005° for the Trochoid curve when the method of the present invention is used, while the maximum angular difference is about 2.0° for the Bowditch curve and about 0.14° for the Trochoid curve when the conventional method is used. The comparison indicates that the maximum angular difference according to the method of the present invention is smaller than that of the conventional method. In Table 2, the symbol * indicates that the calculation time is shorter than 0.01 second.

TABLE 1

| Model | Max Error (%) | Ave Error (%) | Max Angle (°) | Ave Angle (°) | Time (sec) |
|---|---|---|---|---|---|
| Bowditch | 8.6E−12 | 1.2E−13 | 2.4E−02 | 2.3E−3 | 1.72 |
| Trochoid | 4.8E−14 | 3.5E−15 | 5.0E−03 | 5.0E−04 | 1.78 |

TABLE 2

| Model | Max Error (%) | Ave Error (%) | Max Angle (°) | Ave Angle (°) | Time (sec) |
|---|---|---|---|---|---|
| Bowditch | 5.4E−12 | 2.5E−14 | 2.05 | 2.8E−2 | * |
| Trochoid | 1.1E−14 | 2.4E−15 | 0.14 | 1.9E−2 | * |

Figure 11A:
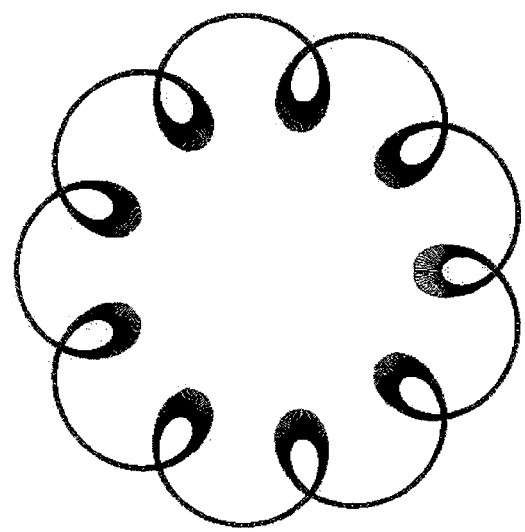
FIG. 11 is a diagram showing the comparison between an interpolation result of the present invention and an interpolation result of the conventional method.
Figure 11B:
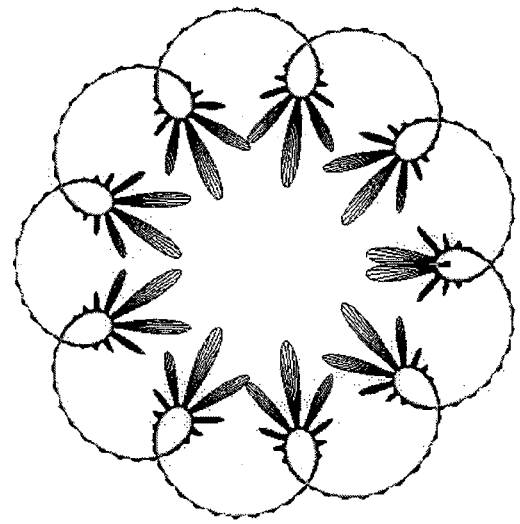
Figure 11C:
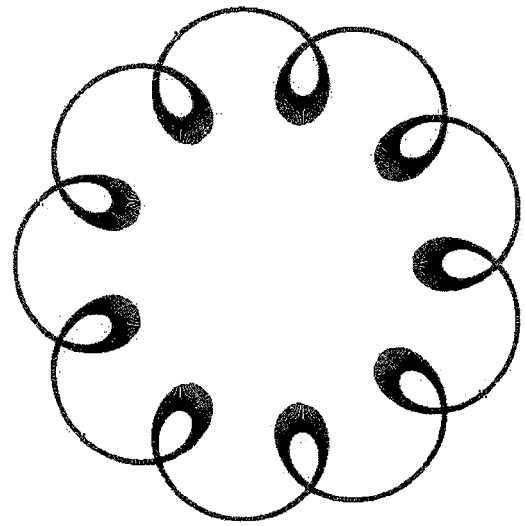

Next, FIG. 11A shows the curvature line diagram of the Trochoid curve interpolated by the method of the present invention, FIG. 11B shows the interpolation by the conventional method (Non-Patent Document 1), and FIG. 11C shows the interpolation by the conventional method (Hermite interpolation).

In the conventional method (Non-Patent Document 1), an interpolation point requires about twice as many control points for a curve, and about three times as many control points for a curved surface, with a result that an increase in the number of control points causes unwanted vibrations in the curve (FIG. 11B). In contrast, in the interpolation method according to the present invention where the number of control points is approximately equal to the number of interpolation points, such unwanted vibrations are suppressed (FIG. 11A).

In addition, though the conventional method requires the user to enter the magnitude of a tangent vector at each point, the present invention eliminates such a need and allows interpolation to be performed without human intervention, thus making it possible to automate the processing.

Figure 12A:
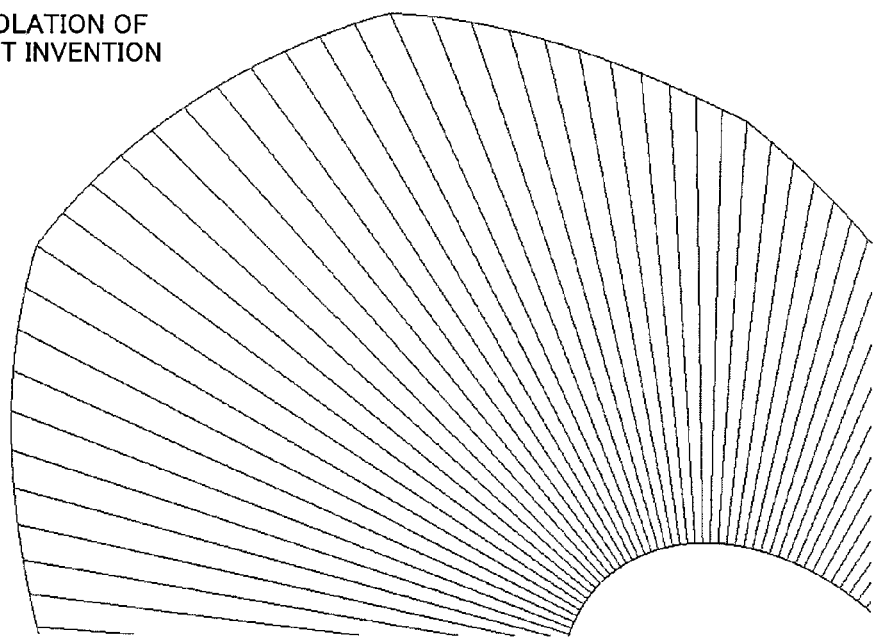
FIG. 12 is a diagram showing the comparison between an interpolation result of the present invention and an interpolation result of the conventional method.
Figure 12B:
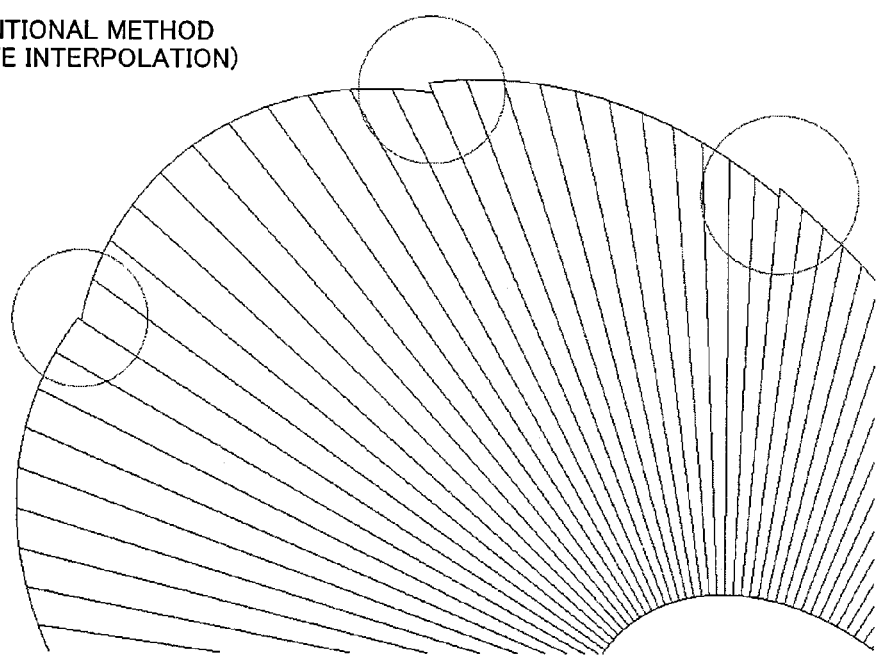

FIG. 12A is a close-up of apart of the curvature line diagram of the curve for which the interpolation according to the present invention shown in FIG. 11A is performed, and FIG. 12B is a close-up of a part of the curvature line diagram of the curve for which the interpolation of the conventional method (Hermite interpolation) shown in FIG. 11B is performed.

The interpolation of the present invention uses a cubic B-Spline curve with a continuous curvature because a cubic B-Spline curve guarantees $C^2$ continuity (FIG. 12A) ($C^2$, which indicates curvature continuity, is distinguished from C that represents the curve given above). Because the conventional method (Hermite interpolation) does not guarantee curvature continuity, the curvature is discontinuous at some points on the curve as shown by the circled parts in the figure (FIG. 12B).

As described above, the interpolation method according to the present invention generates a smoother curve with a continuous curvature than the conventional method.

Figure 13:
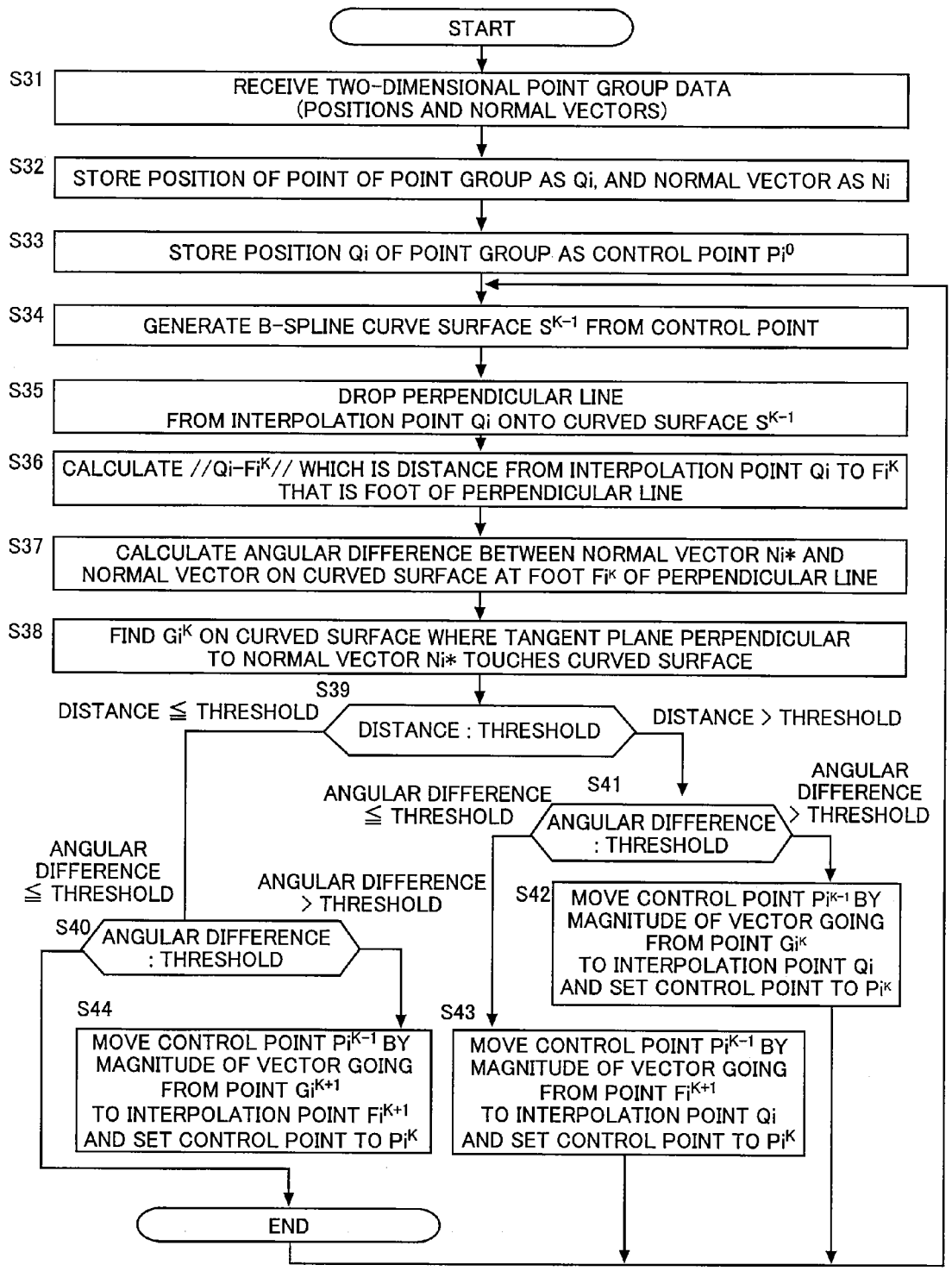
FIG. 13 is a flowchart showing the generation of a curved surface from a three-dimensional point group.

Next, the following describes the generation of a B-Spline curved surface from a three-dimensional point group (including information on positions and normal lines) with reference to the flowchart in FIG. 13. Note that the flowchart shown below in FIG. 13 is exemplary only and that any other flow may also be used if the steps and the procedure are those for performing the first interpolation processing, the second interpolation processing, and the third interpolation processing of the present invention.

From the point group, the positions are stored as Q and the normal vectors are stored as N* (S31, S32). The obtained interpolation point Qi is stored as the initial control point $P^0 i$ (S33). The B-Spline curved surface $S^{k-1}$ is generated from the control point $P^{k-1} i$. The superscript K indicates the number of times the interpolation processing is performed.

In the subsequent processing, any of the first interpolation processing shown in S35 and S36, the second interpolation processing shown in S37 and S38, and the third interpolation processing shown in S42-S44 is repeated to generate a B-Spline curved surface S that interpolates the positions and the normal vectors of the point group.

In the first interpolation processing, a perpendicular line is dropped from the interpolation point onto the curved surface S and the first point $F^k i$ that is the foot of this perpendicular line is found. In the first interpolation processing, the curved surface S is the curved surface $S^0$ generated from the control point $P^0$ obtained in the step S33 and, in the second and subsequent interpolation processing, the curved surface $S^k$ generated from the control point $P^k i$ shifted in one of the steps S41-S43 (S35). The distance $//Qi-F^k i//(=\Delta d)$ between the interpolation point Qi and the first point $F^k i$ that is the foot of the perpendicular line is calculated (S36). The operation for finding the perpendicular line and the distance is performed by differential geometry operation.

Next, in the second interpolation processing, the angular difference $\Delta\theta$ between the normal vector Ni* given to each interpolation point and the normal vector on the curved surface S at the first point $F^k i$ that is the foot of the perpendicular line is found (S37). The point of contact $G^k i$ on the curved surface where the tangent plane perpendicular to the normal vector Ni* touches the curved surface is found as the second point (S38). The angular difference $\Delta\theta$ and the point on the curved surface where the tangent plane perpendicular to the normal vector touches the curved surface are calculated by differential geometry operation.

Next, in the third interpolation processing, one of the three steps S41-S43 is selected based on the distance error $\Delta d$ found in S36 and the angular difference $\Delta\theta$ found in S38, and the selected step is performed. If neither the distance error $\Delta d$ between the interpolation point Q and the curve nor the normal vector angular difference $\Delta\theta$ satisfies the threshold (S39, S41), the position of the control point $P^{k-1} i$ that defines the current curved surface is shifted by the magnitude of the vector going from the point $G^k i$ on the curved surface found in S18 to the interpolation point Qi, and the shifted position is set to the position of the new control point $P^k i$ (S42).

If the distance error $\Delta d$ between the interpolation point Q and the curved surface satisfies the threshold (S39) but the normal vector angular difference $\Delta\theta$ does not satisfy the threshold (S40), the position of the control point $P^{k-1} i$ that defines the current curved surface is shifted by the magnitude of the vector going from the point $G^k i$ on the curved surface found in S38 to the first point $F^k i$ that is the foot of the perpendicular line found in S35, and the shifted position is set to the position of the new control point $P^k i$ (S44).

If the distance error $\Delta d$ between the interpolation point Q and the curved surface does not satisfy the threshold (S39) but the normal vector angular difference satisfies the threshold (S41), the position of the control point $P^{k-1} i$ that defines the current curved surface is shifted by the magnitude of the vector going from the point $F^k i$ that is the foot of the perpendicular line found in S35 to the interpolation point Qi, and the shifted position is set to the position of the new control point $P^k i$ (S43). The operation for shifting the control point is performed by geometry operation.

The steps S34-S44 are repeated until the distance error $\Delta d$ between the curved surface S found in S34 and the interpolation point Qi satisfies the threshold and the angular difference $\Delta\theta$ between the normal vector Ni* and the normal vector on the curved surface S at the first point $F^k i$ that is the foot of the perpendicular line satisfies the threshold respectively. The threshold of the distance error and the threshold of the angular difference correspond respectively to the allowable distance error that is allowed for the distance error for the curved surface that interpolates the point group and to the allowable normal vector angular difference that is allowed for the normal line angular difference.

Therefore, if it is confirmed that the distance error and the normal vector angular difference satisfy the respective thresholds in the comparison steps in S39, S40, and S41, the curved surface S is supposed to interpolate the positions and the normal vectors, given by the point group, in the allowable error range.

An example of the application of the present invention is an offset curve/curved surface. The application of the present invention increases the accuracy of an offset curve/curved surface that is represented as a B-Spline curve/curved surface.

An offset curve/curved surface refers to a curve/curved surface generated by shifting the curve/curved surface a predetermined distance in the normal line direction. All commercially available CAD/CAM software provides the offset function as a pull-down menu and, when the locus of the center of a tool, that is, the tool path, is calculated from CAD/CAM data, which is actually received for use in NC cutting, considering the tool radius, the offset curve/curved surface of a curve/curved surface based on the CAD/CAM data is used. An offset curve/curved surface, which cannot be represented by a polynomial in most cases, cannot be represented directly by a B-Spline curve/curved surface represented by a partitioned polynomial. In this case, it is necessary to sample the offset curve/curved surface as a predetermined point group and to interpolate the resulting point group using a B-Spline curve/curved surface. In this case, because an offset curve/curved surface has a property that the normal lines at the sampled points may be extracted easily and so, by interpolating not only the positions but also normal vectors using a B-Spline curve/curved surface, a B-Spline curve/curved surface closer to the offset curve/curved surface may be obtained and at the same time the number of required sampling points may be reduced. The application of the present invention to the interpolation of a B-Spline curve/curved surface including the normal lines produces a high-quality curve with fewer unwanted vibrations, thus increasing the accuracy of the offset function used in the CAD/CAM software. The present invention does not require the user to specify the magnitude of a tangent vector, allowing for automatic interpolation processing without human intervention.

Another example of the application is to install the function to specify positions, as well as the normal lines at those positions, when modeling operation is performed on CAD/CAM. In the process currently used to create a CAD/CAM model, only the positions are specified in most cases. This means that only position information is used in the operation to design a model or to change the specifications. In this case, the ability to interpolate a curve/curved surface for the positions as well as for the normal lines, if available, allows the normal line specification function to be added, and more operable parameters to be specified, for increasing design flexibility.

The application of the present invention allows interpolation processing to be performed automatically without human intervention and, at the same time, produces a high-quality curve/curved surface having continuous curvature and less unwanted vibrations.

INDUSTRIAL APPLICABILITY

The present invention is applicable to the CAD/CAM modeling field, NC processing, and so forth.

The invention claimed is:

1. An interpolation processing method for interpolating a point group using a curve or a curved surface represented by control points wherein
    said point group has position information on each of interpolation points and vector information on a unit direction vector that defines a direction and a curvature of a curve or a curved surface at the interpolation point,
    said interpolation processing comprises:
    a first interpolation step of performing a geometry algorithm operation for finding a first point on the curve or the curved surface defined by control points based on the position information on each interpolation point, said first point being a foot of a perpendicular line dropped from the interpolation point onto the curve or the curved surface;
    a second interpolation step of performing a geometry algorithm operation for finding a second point based on the vector information, said second point being a point of contact between a tangent of the curve and the curve or between a tangent plane of the curved surface and the curved surface, said tangent or said tangent plane being perpendicular to the unit direction vector; and
    a third interpolation step of performing a geometry algorithm operation for finding a vector going from the first point to the interpolation point, a vector going from the second point to the interpolation point, and a vector going from the second point to the first point as moving vectors and for moving a position of a control point, which defines the curve or the curved surface, using one moving vector, selected from said moving vectors, for determining a moved position as a position of the control point of a new curve or a new curved surface, and
    operation processing for performing the interpolation steps is carried out iteratively by operation means in which the geometry algorithms are included, wherein the operation means includes a processor.

2. The interpolation processing method according to claim 1 wherein said unit direction vector is a normal vector at the interpolation point on the curve or the curved surface that interpolates the interpolation point.

3. The interpolation processing method according to claim 1, comprising the steps of:
    finding a new curve or curved surface based on the control point obtained in said operation processing;
    comparing a distance between the interpolation point and the found curve or curved surface with a threshold; and
    repeating said first interpolation step, second interpolation step, and third interpolation step until the distance satisfies, or becomes smaller than, the threshold.

4. The interpolation processing method according to claim 1, comprising the steps of:
    finding a new curve or curved surface based on the control point obtained in said operation processing;
    comparing an angular difference with a threshold, said angular difference being a difference between the unit direction vector that is set at each interpolation point and a normal vector on the curve or curved surface at the first point that is the foot of the perpendicular line obtained in said first interpolation step; and
    repeating said first interpolation step, second interpolation step, and third interpolation step until the angular difference satisfies, or becomes smaller than, the threshold.

5. The interpolation processing method according to claim 1 wherein,
    when said first interpolation step, second interpolation step, and third interpolation step are performed for the first time, the geometry algorithm operations are performed with each interpolation point of said point group as an initial control point and, when said first interpolation step, second interpolation step, and third interpolation step are performed for the second and subsequent times, the geometry algorithm operations are performed with the position of the control point determined in the interpolation steps as the position of a new control point.

6. The interpolation processing method according to claim 1 wherein said curve is a B-Spline curve and said curved surface is a B-Spline curved surface or a subdivision curved surface.

7. An interpolation processor for interpolating a point group using a curve or a curved surface represented by control points wherein said point group has position information on each of interpolation points and vector information on a unit direction vector that defines a direction and a curvature of a curve or a curved surface at the interpolation point, said interpolation processor comprising:

first geometry operation means that performs a first interpolation step according to a geometry algorithm for finding a first point on the curve or the curved surface defined by control points based on the position information on each interpolation point, said first point being a foot of a perpendicular line dropped from the interpolation point onto the curve or the curved surface;

second geometry operation means that performs a second interpolation step according to a geometry algorithm for finding a second point based on the vector information, said second point being a point of contact between a tangent of the curve and the curve or between a tangent plane of the curved surface and the curved surface, said tangent or said tangent plane being perpendicular to the unit direction vector; and third geometry operation means that performs a third interpolation step according to a geometry algorithm for finding a vector going from the first point to the interpolation point, a vector going from the second point to the interpolation point, and a vector going from the second point to the first point as moving vectors and for moving a position of a control point, which defines the curve or the curved surface, using one of said moving vectors for determining a moved position as a position of the control point of a new curve or a new curved surface wherein said first geometry operation means, second geometry operation means, and third geometry operation means each have a CPU and a storage device for executing the geometry algorithm iteratively via software and a circuit for executing the geometry algorithm via hardware.

8. The interpolation processor according to claim 7 wherein said unit direction vector is a normal vector at the interpolation point on the curve or the curved surface that interpolates the interpolation point.

9. The interpolation processor according to claim 7, further comprising:

comparison means that finds a curve or curved surface based on the control point obtained in said operation processing and compares a distance between the interpolation point and the found curve or curved surface with a threshold; and control means that has a program or circuit configuration for repeating said first geometry operation means, second geometry operation means, and third geometry operation means until the distance satisfies, or becomes smaller than, the threshold based on the comparison result.

10. The interpolation processor according to claim 7, further comprising:

comparison means that finds a curve or curved surface based on the control point obtained in said operation processing and compares an angular difference with a threshold, said angular difference being a difference between the normal vector given to each interpolation point and a normal vector on the curve or curved surface at a point of the foot of the perpendicular line that was found; and control means that has a program or circuit configuration that repeats said first geometry operation means, second geometry operation means, and third geometry operation means until the angular difference satisfies, or becomes smaller than, the threshold.

11. The interpolation processor according to claim 7 wherein said first geometry operation means, second geometry operation means, and third geometry operation means perform the geometry algorithm operation in a first operation with the point group as an initial control point and perform the geometry algorithm operation in second and subsequent operations with the position of the control point, determined in the first operation, as the position of a new control point.

12. The interpolation processor according to claim 7 wherein said curve is a B-Spline curve and said curved surface is a B-Spline curved surface or a subdivision curved surface.

* * * * *